United States Patent [19]

Furiga et al.

[11] 4,387,351
[45] Jun. 7, 1983

[54] WIDEBAND FM MODULATOR AND AFC CONTROL LOOP THEREFOR

[75] Inventors: Andrew Furiga, Scottsdale; Donald J. Sabourin, Mesa, both of Ariz.

[73] Assignee: Motorola Inc., Schaumburg, Ill.

[21] Appl. No.: 217,600

[22] Filed: Dec. 18, 1980

[51] Int. Cl.³ .......................... H03C 3/00; H03L 7/06
[52] U.S. Cl. ................................... 332/19; 332/16 R; 328/134; 331/18; 331/23; 455/75; 455/119
[58] Field of Search ................... 332/16 R, 19, 23 R; 331/18, 23; 455/113, 119, 126, 75; 307/526; 328/134, 155

[56] References Cited

U.S. PATENT DOCUMENTS

| | | | |
|---|---|---|---|
| 4,006,429 | 2/1977 | Talbot | 332/19 X |
| 4,128,811 | 12/1978 | Englund, Jr. | 328/134 |
| 4,286,237 | 8/1981 | James | 332/19 |

Primary Examiner—Siegfried H. Grimm
Assistant Examiner—Edward P. Westin
Attorney, Agent, or Firm—Eugene A. Parsons

[57] ABSTRACT

An AFC loop for controlling the frequency of a VCO including an A to D converter and divider for providing pulses at some frequency equal to or lower than the output of the VCO, a source of stable reference pulses and a counter constructed to count to a predetermined number and count the reference pulses in synchronism with the divided pulses, a second divider connected to divide the reference pulses by the predetermined number and means for subtracting the output of the second divider from the counter to provide a control voltage for the VCO which is proportional to the drift in frequency of the VCO from a mean frequency.

14 Claims, 2 Drawing Figures

WIDEBAND FM MODULATOR AND AFC CONTROL LOOP THEREFOR

BACKGROUND OF THE INVENTION

The center frequency stability of a wideband FM modulator utilizing a voltage controlled oscillator (VCO) is inversely proportional to the maximum frequency deviation of the modulator. An automatic frequency control (AFC) loop can be incorporated to provide increased stability of the VCO frequency. AFC loops can be categorized as primarily analog or digital in nature. The standard analog AFC loop designs become non-linear in applications requiring large deviations and wide bandwidths. The standard digital AFC loop designs have highly linear transfer characteristics but possess inherent problems which limit the frequency stability improvement.

The major elements of the AFC loop are: a frequency discriminator capable of linearly converting the modulator frequency deviations to an error voltage; and, a loop filter which must adequately filter the error voltage such that the modulating signal does not appear at the VCO input. The discriminator is a frequency to voltage converter. As the input frequency to the discriminator changes, a corresponding voltage change occurs at the discriminator output. The VCO input is composed of the desired modulation signal (generated by a signal conditioner or the like) and an error signal (generated by the discriminator). Obviously, the discriminator and signal conditioner cannot possess the same frequency response because the error voltage would tend to cancel the desired modulation. The discriminator must be capable of detecting very slow center frequency drift rates, in the presence of FM and provide enough error signal to correct for the drift. Thus, the discriminator's frequency response must be of a low pass characteristic. Since the desired modulation and the error signal cannot occupy the same frequency domain, the first two system restrictions are imposed. One, the desired modulation signal must possess a high pass characteristic, and two, the error signal must possess a low pass characteristic.

Considering the nature of FM, the presence of a center frequency spectral component may be non-existent. It will be necessary for the discriminator to convert the entire output spectrum of the VCO to a corresponding voltage at the output of the discriminator and not rely on the presence of a single frequency component. Not only must the discriminator possess a broad band response at its input but it must possess a high degree of symmetry about its origin at the output. Traditional discriminators possess the familiar "S" curve transfer function. A high degree of origin symmetry and linearity is maintained over only a small portion of their dynamic range.

Existing designs of discriminators employ pulse (time averaging) techniques or tuned circuits. The time averaging techniques is the most linear of the two schemes for FM demodulation, and possesses a wider input bandwidth than the tuned circuit. A commonly used time averaging discriminator is a monostable multivibrator of a known pulse width and externally triggered on each new cycle of input frequency. Time averaging discriminators are discussed at page 419, 420 of *Operational Amplifiers*, published by Burr-Brown, copyrighted 1971, and edited by Jerald G. Groeme, Gene E. Toby and Lawrence P. Huelsman. Monostable multivibrators are not well known for constant pulse width over temperature. Thus, while these prior art discriminators may provide the required linearity and bandwidth, they are extremely unstable over wide ambient temperature fluctuations and over long terms.

SUMMARY OF THE INVENTION

The present invention pertains to an improved digital frequency discriminator for use in a wideband FM modulator, which discriminator utilizes a stable reference frequency source and a counter synchronized to the input signal to produce a pulse signal having an average duty factor that varies linearly with the frequency of the input signal, a second counter continuously counting the cycles of the reference frequency to provide a pulse signal having a constant duty factor approximately equal to the average duty factor of the pulse signal from the counter at a desired mean frequency of the input signal, and circuitry for receiving the two pulse signals and providing a DC control voltage equivalent to the difference between the average voltages thereof, which control voltage is utilized to control the VCO that supplies the input signals to the discriminator toward the desired mean frequency. The AFC loop including the VCO also contains a high speed voltage translator for converting the analog output of the VCO to digital pulses and a divider for reducing the frequency of the pulses. Other features including common semiconductor substrates and constant frequency adjusting voltages are incorporated to reduce errors due to temperature differentials and the like.

It is an object of the present invention to provide a new and improved digital frequency discriminator.

It is a further object of the present invention to provide a new and improved digital frequency discriminator in conjunction with an improved AFC loop for use in a wideband FM modulator.

It is a further object of the present invention to provide a method of increasing the center frequency stability of a wideband FM modulator utilizing a VCO.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
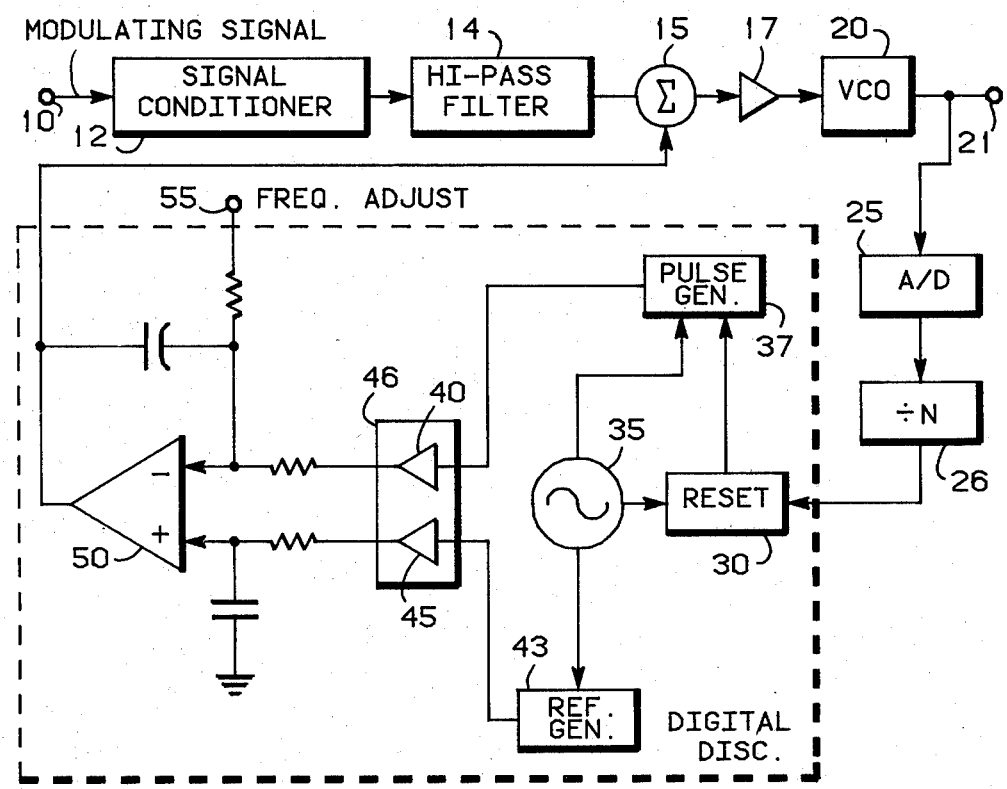
FIG. 1 is a simplified block diagram of a wideband FM modulator embodying the present invention.

Referring specifically to FIG. 1, a wideband FM modulator is illustrated having an input terminal 10 for receiving a modulating signal. The terminal 10 is connected to a signal conditioner block 12 which simply contains circuitry for providing required amplification or gain adjustment to set the desired output modulation of the modulator. The signal from the conditioner 12 is supplied through a high pass filter 14, to eliminate bias errors at the signal conditioner 12 output, to a summation circuit 15. The output of the summation circuit 15 is supplied through an amplifier 17 to the control input of a voltage controlled oscillator (VCO) 20. The VCO 20 is an oscillator whose output frequency is ideally linearly related to the instantaneous voltage at its control input. The instantaneous output frequency of the VCO, designated $F_o$, is $$F_o = F_K + SV_i$$

where $F_K$ is the frequency of the VCO with no input signal (in this embodiment 1.7 MHz), S is the sensitivity of the VCO (Hertz per volt), and $V_i$ is the instantaneous voltage at the control input of the VCO. The output frequency of the VCO is available at a modulator output terminal 21. It will be understood by those skilled in the art that the output of the modulator might be provided at a variety of other places depending upon the output desired (i.e. digital, analog, divided, etc.).

To provide the desired stability of the center frequency of the VCO 20, an automatic frequency control (AFC) loop is connected from the output of the VCO 20 to a second input of the summation circuit 15. The AFC loop includes the following circuits. The output of the VCO 20 is connected through an analog to digital converter 25 to a first divider 26. The divider 26 is a divide by n circuit where n is any integer, limited only by required loop gain. The divided output frequency supplied by the divider 26 is applied to reset circuitry 30. A reference frequency source 35 also supplies an input to the reset circuitry 30. The source 35 should include a relatively stable oscillator as, for example, a crystal oscillator which operates at some predetermined integer times the input from the divider 26. The source 35 and the reset circuitry 30 each supply signals to a pulse generator 37 which may, for example, be a binary counter. The reset circuitry 30 generates a reset pulse of duration equal to the period of one cycle of the source 35 and coincident with the first positive transition of the output signal from the source 35 after each positive transition of the input signal from the divider 26. The reset pulse from reset circuitry 30 initiates an output pulse from the pulse generator 37 whose duration is a predetermined number of cycles of the signal from the source 35. The frequency of the output pulses from the pulse generator 37 is determined by the periodic reset pulse generated by the reset circuitry 30. The average duty factor of the pulse generator 37 output varies linearly with the input frequency of the reset circuitry 30. The constant width pulses from the pulse generator 37 are applied to a first buffer circuit 40. The reference frequency from the source 35 is also supplied to a reference generator 43 which may also be, for example, a binary counter. The reference generator 43 divides the frequency from the source 35 by a predetermined integer to provide an output signal composed of a continuous stream of constant width pulses. The duty factor of the output signal of reference generator 43 is approximately equal to the average duty factor of the signal outputted from the pulse generator 37 when the VCO 20 is providing the proper output mean frequency. The continuous stream of constant width pulses from the generator 43 are supplied to a second buffer circuit 45. Both of the buffer circuits 40 and 45 are formed on a common semiconductor substrate, schematically indicated by block 46, to reduce temperature variations therebetween. The outputs of the buffer circuits 40 and 45 are supplied to negative and positive inputs, respectively, of an operational amplifier 50. The operational amplifier 50 forms a combining circuit to convert the digital pulses supplied to the buffer circuits 40 and 45 to an analog or DC control signal which is equivalent to the difference between the duty factors of the signals supplied to the two buffer circuits 40 and 45, and also low pass filters these signals so that a pure DC control signal is supplied to the input of the summation circuit 15. An input terminal 55 is adapted to receive a variable voltage thereon, which voltage is supplied to the negative input of the operational amplifier 50 for biasing or altering the output signal therefrom to adjust the center frequency of the VCO 20. It will of course be understood that the specific circuit illustrated and the specific connections described may be changed, reversed, or altered to provide a similar function in a slightly different manner.

In the specific embodiment illustrated, the divider 26 is a divide by four circuit, the source 35 provides a signal at a frequency ten times the frequency of the pulses from the divider 26, the pulse generator 37 is a 4-bit binary counter whose output pulse width is equal to eight input pulses, and the reference generator 43 is a decade counter whose output pulse width is equal to eight input pulses. Since the pulse generator 37 and reference generator 43 are binary counters that count to eight pulses, the width of the output pulses therefrom is always equal to exactly eight cycles of the reference pulses from the source 35. While the output pulses from the reference generater 43 will be a continuous stream of constant duty factor pulses, the pulses from the pulse generator 37 will be constant width but the individual output periods, or duty factors, will be equal to eight, nine, ten, eleven or twelve times the reference frequency period, depending on the phasing and instantaneous frequency difference between the modulated input signal and the reference signal from the source 35. When a large number of output pulse periods (duty factors) from the pulse generator 37 are averaged, the resultant output period (duty factor) approaches the average period of the input frequency from the divider 26. The averaging time has to be long enough to average out the effects of the lowest modulation frequency as well as average out the effects of the discrete pulse periods, especially at small frequency offsets. The output of the pulse generator 37 has a fixed pulse width of $$8/(10F_o) \text{ sec.}$$

where $10F_o$ is equal to the output frequency of the source 35. The average output voltage of the pulse generator 37 is written as;

$$V_{ave} = \frac{A_1 8}{10F_0}(F_0 + \Delta F_0) = .8A_1 + \frac{.8A_1 \Delta F_0}{F_0}$$

where $A_1$ is the amplitude of the pulses from the pulse generator 37 and $\Delta F_o$ is the drift error of the VCO output frequency. Several problems exist if the output pulses from the pulse generator 37 are directly integrated to drive the VCO 20. $A_1$ is highly dependent on the power supply voltage and circuit amplitude variations. The pulse width is somewhat dependent on the high-to-low and low-to-high propagation delay times. Without some means of compensation, the variations due to the first term of the above equation are too excessive. Compensation is achieved by the generation of an offset voltage in the reference generator 43 which is combined with (subtracted from) the averaged output voltage from the pulse generator 37. The resulting error voltage at the output of amplifier 50 is relatively insensitive to power supply variations and circuit amplitude variations. The result is to eliminate the need for complex leveling circuitry at the pulse generator 37 output and expensive regulated power supplies.

The reference generator 43 may, for example, contain a BCD counter which runs continuously and is clocked by the pulses from the source 35. The BCD counter counts to a predetermined integer or, essentially, divides the reference pulses frequency by the predetermined integer to provide a continuous stream of constant duty factor pulses, which in this embodiment have a width equal to the width of the pulses from the pulse generator 37. It will of course be understood by those skilled in the art that the relative width of the pulse is inconsequential as long as the duty factor of the pulse signal from the reference generator 43 remains equal to the average duty factor of the pulse signal from the pulse generator 37. The average output voltage of the reference generator 43 is:

$$V_{ave} = A_2(8F_o/F_o 10) = 0.8A_2$$

When the output from the reference generator 43 is subtracted from the output of the pulse generator 37 in the operational amplifier 50 the result is:

$$V_{ave} = \frac{0.8 [F_0 + \Delta F_0]}{F_0} A_1 - 0.8A_2$$

$$= \frac{0.8 \Delta F_0 A_1}{F_0} + 0.8A_1 - 0.8A_2$$

If $A_1$ is equal to $A_2$, only the first term in the above equation remains.

In reality, $A_1$ and $A_2$ are not exactly equal and their temperature dependence are not exactly equal since they are developed in different circuits. To reduce the temperature coefficient problem, both signals are buffered on a common circuit 46 but small differences in amplitudes may still exist. It will of course be understood that the reference signal source 35, pulse generator 37, reference generator 43, reset circuitry 30, divider 26 and A to D converter 25 could all, or any portion thereof, be formed on a single IC circuit to further reduce temperature dependency and other differences if desired, but the common buffer circuits 46 compensate for the major differences. The adjustable voltage source at the terminal 55 is used to eliminate the small difference between the two signal amplitudes as well as provide for a center frequency adjust.

The entire processing scheme of the digital discriminator relies on speed at which the digital circuitry can operate. High speed devices are used to minimize effects of propagation delays and, therefore, undesired variations. The frequency from the output of the VCO 20 is divided by a factor of n in the divider 26 to further reduce possible time variations inherent to the integrated circuits used. A second advantage of dividing the output frequency of the VCO in the divider 26 is that its permits the source 35 to generate at a lower frequency. It will of course be understood by those skilled in the art that the division is not necessary to the invention and can be eliminated if the above advantages are not required. Since the discriminator is digital in nature, the analog output of the VCO 20 must be converted to a digital signal. Thus, the analog to digital converter 25 is included. It will of course be understood that this may simply be a level translator, a zero crossing detector or any other device which will convert the signals at the output of the VCO 20 to a generally digital form. Various amplifiers and other amplification, e.g. amplifier 17, are included in the loop to provide the necessary gain for proper loop operation. Additional amplification may be necessary because the closed loop frequency response of the AFC loop is a function of the loop gain as well as the pole of the low pass filter (operational amplifier 50) in the feedback loop.

Figure 2:
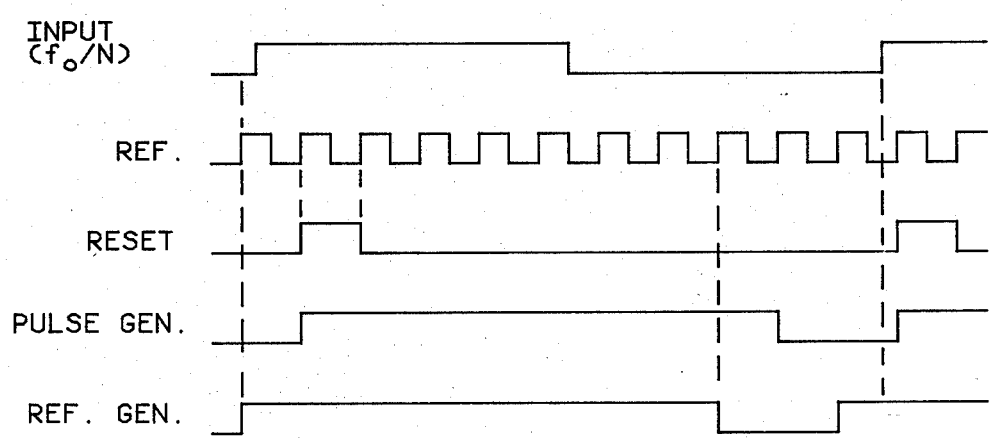
FIG. 2 illustrates several voltage waveforms generally as they appear at the outputs of various components in the modulator of FIG. 1.

Referring to FIG. 2, waveforms are illustrated which generally depict the outputs of various circuits illustrated in FIG. 1. The waveform labeled "input" illustrates the output of the divider 26, the waveform labeled "ref." illustrates the output of the source 35, the waveform labeled "reset" illustrates the output of the reset circuitry 30, the waveform labeled "pulse gen." illustrates the output of the pulse generator 37 and the waveform labeled "ref. gen." illustrates the output of the reference generator 43. The waveforms generally illustrate the timing and interrelationship of the various signals.

Propagation delays that effect the pulse width of the pulse generator 37 and reference generator 43 outputs will produce propagation delay errors. Since the pulse signals generated by the reference generator 43 are subtracted from the pulse signals generated by the pulse generator 37, common mode variations are cancelled. Differential errors are mainly contributed by the two generators 37 and 43, or counters included therein. If the pulse generator 37 and reference generator 43 include counters, Schottky TTL devices are used in the counters to minimize these differential delays. These devices exhibit a propagation delay temperature coefficient of $-0.01$ nanoseconds per degree centigrade between rising and falling edges. The differential delay coefficient between two nearly identical devices is estimated at $-0.001$ nanoseconds per degree centigrade. It can be shown that this results in a frequency error at the output of VCO 20 of approximately 0.91 Hertz per degree centigrade. The drift error contributed by the high and low state output voltage changes into the operational amplifier 50 is primarily a function of the differential high state voltage variation of two identical buffers 40 and 45 on the same chip 46. In the present embodiment commercially available buffers, such as those sold under the designation SN54LS04 or SN74LS04, are utilized. From manufacturer's data, the buffers exhibit approximately $+3$ millivolts per degree centigrade high state voltage variation. From experimental data, differential variation is estimated at $+5$ microvolts per degree centigrade. It can be shown that this will result in a frequency error of approximately 3.03 Hertz per degree centigrade. The operational amplifier 50 utilized as an integrator/summer exhibits $\pm 5$ microvolts per degree centigrade input offset voltage variation. It can be shown that this variation results in a frequency error at the output of the VCO 20 of approximately $\pm 3.03$ Hertz per degree centigrade. The oscillator used in the source 35 exhibits a $-10$ ppm frequency variation over the temperature range of 0° to 50° C. This error referenced to the VCO 20 frequency output results in a variation of $-0.34$ Hertz per degree centigrade. The VCO 20, which is a commercially available unit is originally specified at $\pm 0.05\%$ per degree centigrade and this error is reduced by the described AFC loop to result in $\pm 0.32$ Hertz per degree centigrade. It should be noted that the propagation delay and reference oscillator errors have a negative slope temperature coefficient while output voltage drift has a positive slope, tending to cancel each other. Since it cannot be expected that the propagation delay, reference oscillator and output voltage drift errors will have the maximum error, the resultant coefficient of the three error sources is assumed to be 2.0 Hertz per degree centigrade. The remaining two terms can have either negative or positive coefficients so that worst case total error considers the positive coefficients. The total frequency error thus results in ±133.8 Hertz variation at 1.7 megahertz or ±0.0079 percent over temperature (0° to 50° C.). It can be seen that this far exceeds the best available commercial units meeting the modulator requirements which have a total frequency error no better than ±1.25 percent over temperature (0° to 50° C.).

Thus, an improved wideband FM modulator utilizing a new and impoved digital, frequency discriminator is disclosed. The improved digital frequency discriminator enables the frequency stabilization of relatively inaccurate voltage controlled oscillators. Also, while only a portion of the AFC loop is formed on a single IC chip (common substrate) it will be understood by those skilled in the art that much of the disclosed circuitry may be included on a single chip for ease in implementation and manufacture.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. A digital, frequency discriminator providing an output signal representative of the mean frequency of an input frequency spectrum applied thereto, comprising:
   (a) input means for supplying a digital signal representative of the input frequency;
   (b) a reference frequency source;
   (c) a reset pulse generator connected to said input means and said reference frequency source for providing a reset pulse in response to the application thereto of an appropriate signal from each of said input means and said reference frequency source;
   (d) a first generator connected to said reference frequency source and said reset pulse generator for providing an output signal including a pulse each time a predetermined number of cycles from said reference frequency source and a reset pulse from said reset pulse generator are supplied thereto, the output signal of said first generator having an average duty factor which varies linearly with the frequency of the reset pulses;
   (e) a second generator connected to said reference frequency source for providing an output signal including a pulse for each predetermined number of cycles applied thereto by said reference frequency source, the output signal of said second generator having a substantially constant duty factor approximately equal to the average duty factor of the output signal of said first generator at a desired mean frequency; and
   (f) combining means connected to said first and second generators for combining the output signals from said first and second generators to provide an average voltage signal representing the difference between the output signal from said first generator and the output signal from said second generator.

2. A digital frequency discriminator as claimed in claim 1 wherein the first and second generators each include a counter clocked by the reference frequency source.

3. A digital frequency discriminator as claimed in claim 2 wherein the counters are formed from Schottky TTL devices.

4. A digital frequency discriminator as claimed in claim 1 wherein the input means includes a divider for reducing the frequency of the digital signal by a predetermined integer.

5. A digital frequency discriminator as claimed in claim 4 wherein the reference frequency source operates at a predetermined integer times the output frequency of the divider in the input means.

6. A digital frequency discriminator as claimed in claim 5 wherein the predetermined integer of the divider is 4 and the predetermined integer of the reference frequency source is 10.

7. A digital frequency discriminator as claimed in claim 1 wherein the combining means includes two buffer circuits formed on a common semiconductor substrate each connected to receive the output signals from a different one of the first and second generators.

8. A digital frequency discriminator as claimed in claim 7 wherein the combining means further includes an operational amplifier having two inputs one each connected to the two buffer circuits for receiving output signals therefrom.

9. A digital frequency discriminator as claimed in claim 8 wherein the combining means further includes an adjustable DC voltage source connected to one of the two inputs of the operational amplifier for frequency compensation and adjustment.

10. A wideband FM modulator including an automatic frequency control loop comprising:
   (a) a voltage controlled oscillator having an input and an output, the voltage controlled oscillator providing an output frequency spectrum varying about a mean frequency;
   (b) an analog to digital converter connected to the output of said voltage controlled oscillator and providing output pulses at the same frequency as signals at the output of said voltage controlled oscillator;
   (c) a first divider connected to said converter for dividing the frequency of the output pulses therefrom by a predetermined integer;
   (d) a reference frequency source having a frequency greater than the frequency of the pulses from said divider by a predetermined integer times the frequency of the pulses from said divider;
   (e) reset circuitry connected to said divider and said reference frequency source and supplying an output pulse at the first positive zero crossing of the reference frequency after each positive zero crossing of the output pulses from said divider;
   (f) a resettable counter constructed to count a predetermined number of input cycles and connected to said reset circuitry and said reference frequency source, said counter being connected to start counting with the reception of a reset pulse and to count the reference frequency cycles, the resettable counter providing an output signal having an average duty factor which varies linearly with the frequency of the reset pulses;

(g) a second divider connected to the reference frequency source and dividing the output thereof by an integer such that an output signal is provided having a duty factor approximately equal to the average duty factor of the output signal from said resettable counter at a desired mean frequency;

(h) first and second buffer circuits formed on a common semiconductor substrate and each connected to a different one of said resettable counter and said second divider;

(i) an operational amplifier having two inputs with one each connected to said first and second buffer circuits, said operational amplifier being constructed to provide a DC output voltage proportional to the difference between the signals applied to said first and second buffer circuits; and (j) means connecting the DC output voltage from said operational amplifier to the input of said voltage controlled oscillator.

11. A wideband FM modulator as claimed in claim 10 wherein the integer of the second divider is equal to the predetermined number counted by the resettable counter.

12. A method of controlling the mean frequency of the output of a voltage controlled oscillator comprising the steps of:

(a) providing a continuous stream of reference cycles at a frequency higher than the center frequency of the voltage controlled oscillator;

(b) utilizing the reference cycles and the voltage controlled oscillator output to produce a first output signal including relatively constant width pulses synchronized by the voltage controlled oscillator output, the first output signal having an average duty factor which varies linearly with the frequency of the voltage controlled oscillator output;

(c) utilizing the reference cycles to produce a second output signal including relatively constant width pulses, the second output signal having a duty factor approximately equal to the average duty factor of the first output signal at a desired mean frequency;

(d) subtracting the first and second output signals to provide a control voltage for the voltage controlled oscillator for controlling the voltage controlled oscillator toward the desired mean frequency.

13. A method as claimed in claim 12 including in addition the step of supplying a relatively constant frequency adjust voltage at the subtracting step to compensate for differences in constants during the operation.

14. A method of controlling the mean frequency of a voltage controlled oscillator comprising the steps of:

(a) converting the output signals of the oscillator to pulses and dividing the pulses to reduce the frequency;

(b) providing a continuous stream of reference cycles at a frequency higher than the center frequency of the divided pulses;

(c) utilizing the reference cycles and the divided pulses to produce an output signal including constant pulse width pulses synchronized by the divided pulses and having a width equal to a predetermined number of the reference pulses;

(d) dividing the reference pulses by the predetermined number to produce a continuous stream of pulses having a width equal to the constant pulse width pulses; and (e) subtracting the average value of the voltage of the continuous stream of constant pulse width pulses from the average value of the voltage of the relatively constant pulse width pulses synchronized by the divided pulses to provide a control voltage for the oscillator.

* * * * *